(12) United States Patent
Ke et al.

(10) Patent No.: US 12,346,168 B2
(45) Date of Patent: Jul. 1, 2025

(54) DEVICE ARRAY SUBSTRATE AND DISPLAY DEVICE

(71) Applicant: AUO Corporation, Hsinchu (TW)

(72) Inventors: Tsung-Ying Ke, Hsinchu (TW); Zih-Shuo Huang, Hsinchu (TW)

(73) Assignee: AUO Corporation, Hsinchu (TW)

( * ) Notice: Subject to any disclaimer, the term of this patent is extended or adjusted under 35 U.S.C. 154(b) by 0 days.

(21) Appl. No.: 18/513,618

(22) Filed: Nov. 19, 2023

(65) Prior Publication Data

US 2024/0085955 A1 Mar. 14, 2024

Related U.S. Application Data

(63) Continuation of application No. 16/888,864, filed on Jun. 1, 2020, now abandoned.

(60) Provisional application No. 62/878,857, filed on Jul. 26, 2019.

(30) Foreign Application Priority Data

Mar. 12, 2020 (TW) ................................ 109108162

(51) Int. Cl.
| | |
|---|---|
| *G06F 1/16* | (2006.01) |
| *G06F 1/18* | (2006.01) |
| *G09F 9/30* | (2006.01) |
| *H10K 59/125* | (2023.01) |
| *H10K 59/131* | (2023.01) |
| *H10K 77/10* | (2023.01) |

(52) U.S. Cl.
CPC ............ *G06F 1/1652* (2013.01); *G06F 1/189* (2013.01); *G09F 9/301* (2013.01); *H10K 59/125* (2023.02); *H10K 59/131* (2023.02); *H10K 77/111* (2023.02)

(58) Field of Classification Search
None
See application file for complete search history.

(56) References Cited

U.S. PATENT DOCUMENTS

| | | | | |
|---|---|---|---|---|
| 2012/0061664 | A1* | 3/2012 | Yamazaki | H10K 59/1213 |
| | | | | 257/43 |
| 2014/0299362 | A1* | 10/2014 | Park | H05K 1/0283 |
| | | | | 174/254 |
| 2017/0003440 | A1* | 1/2017 | Kim | H01L 23/5387 |
| 2017/0315399 | A1* | 11/2017 | Kwon | G02F 1/1345 |
| 2018/0046221 | A1* | 2/2018 | Choi | H05B 33/22 |
| 2018/0114825 | A1 | 4/2018 | Hong et al. | |
| 2019/0088894 | A1* | 3/2019 | Park | H10K 59/126 |
| 2019/0259825 | A1* | 8/2019 | Hong | H10K 50/844 |
| 2020/0119131 | A1* | 4/2020 | Ohara | H05B 33/02 |

* cited by examiner

*Primary Examiner* — Khaja Ahmad
(74) *Attorney, Agent, or Firm* — JCIPRNET

(57) ABSTRACT

A device array substrate is provided and includes a flexible base, a pixel island, and a connection line. The pixel island is disposed on the flexible base, and at least one edge of the pixel island is provided with at least one opening. The connection line enters the pixel island via the opening. A display device is also provided and includes the device array substrate.

19 Claims, 8 Drawing Sheets

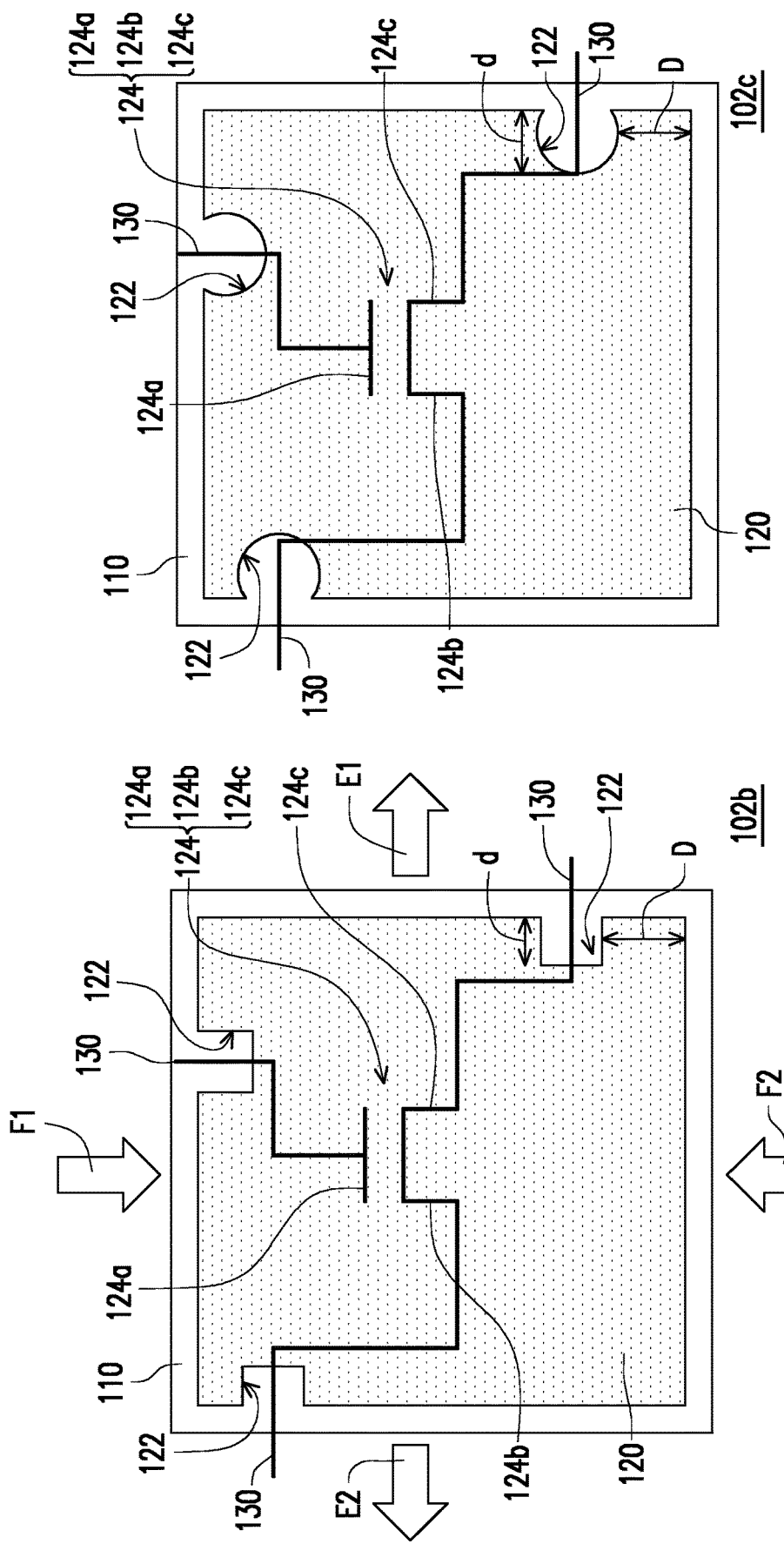

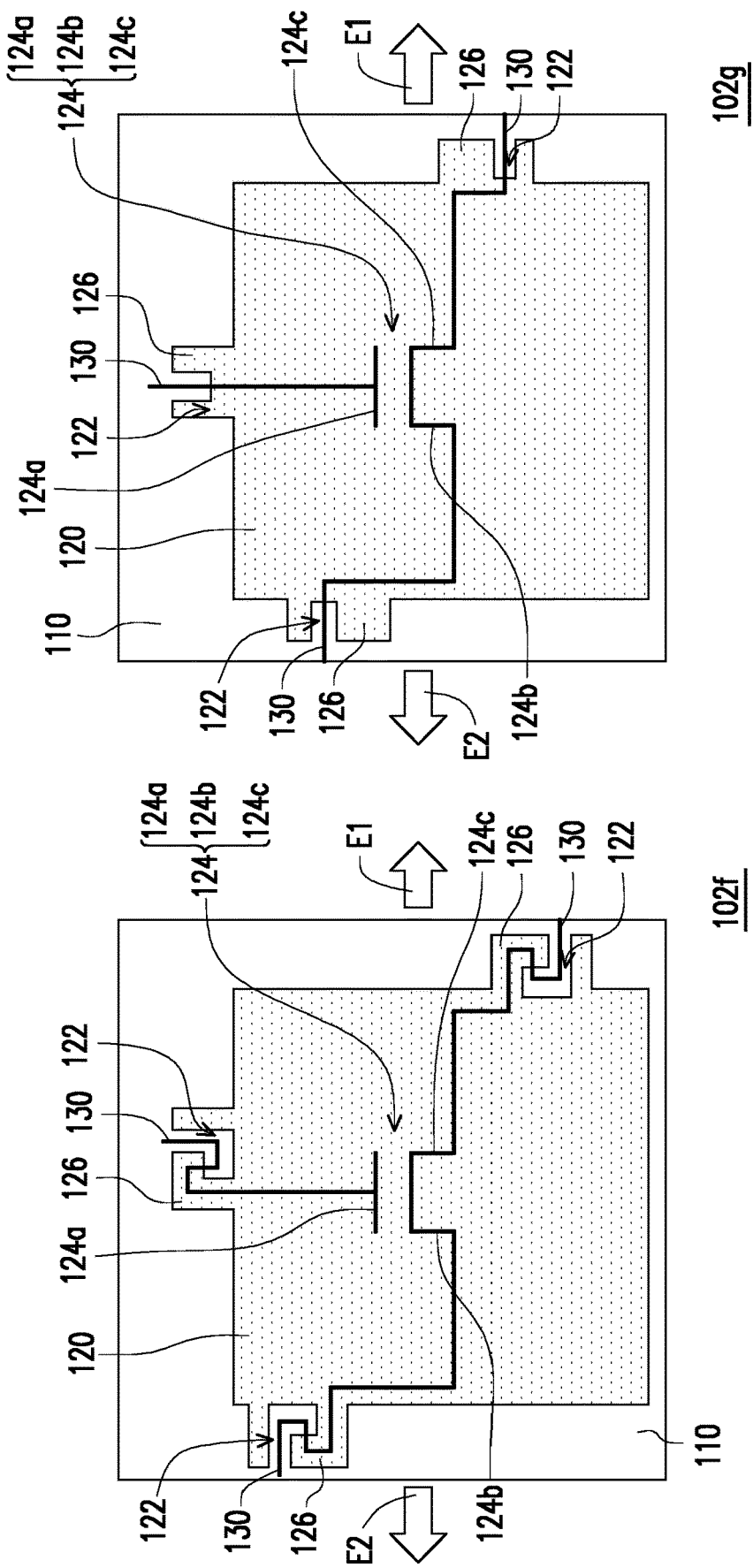

DEVICE ARRAY SUBSTRATE AND DISPLAY DEVICE

CROSS-REFERENCE TO RELATED APPLICATION

This application is a continuation application of and claims the priority benefit of U.S. application Ser. No. 16/888,864, filed on Jun. 1, 2020. The prior U.S. application Ser. No. 16/888,864 claims the priority benefits of U.S. provisional application Ser. No. 62/878,857, filed on Jul. 26, 2019, and Taiwan application serial no. 109108162, filed on Mar. 12, 2020. The entirety of each of the above-mentioned patent applications is hereby incorporated by reference herein and made a part of this specification.

BACKGROUND OF THE INVENTION

Field of the Invention

The invention relates to an array substrate and a display device, and in particular to a stretchable device array substrate and a display device having the device array substrate.

Description of Related Art

The technical development trend of the stretchable display device is gradually moving towards the use of elastically stretchable wiring to form independent island electronic devices. In this way, when the display device is stretched by force, the main deformation amount may be concentrated in the wiring region, and damage to the non-stretchable island electronic devices may be avoided.

However, the connection between the wiring and the island electronic devices is often subjected to huge stress, making the wiring very likely to break when the display device is stretched.

SUMMARY OF THE INVENTION

An embodiment of the invention provides a device array substrate and a display device that may reduce the breakage of wiring when stretched.

The invention provides a device array substrate including a flexible base, a pixel island, and a connection line. The pixel island is disposed on the flexible base, and at least one edge of the pixel island is provided with at least one opening. The connection line enters the pixel island via the opening.

In an embodiment of the invention, the pixel island includes at least one switching device, and the connection line is electrically connected to the switching device via the opening.

In an embodiment of the invention, a distance from a side of the opening to a side of the pixel island is greater than or equal to 1 micrometer.

In an embodiment of the invention, a distance from an open end of the opening to a closed end of the opening is greater than or equal to 1 micrometer.

In an embodiment of the invention, when viewed from a top view direction of the device array substrate, a shape of the opening includes a quadrangle, a semicircle, a polygon, or a circular arc.

In an embodiment of the invention, the opening is extended by a first distance inside the pixel island in a first direction; the opening is extended by a second distance inside the pixel island in a second direction; and there is a set angle between the first direction and the second direction.

In an embodiment of the invention, the connection line has a wire climbing direction, the device array substrate has a stretching direction, and an angle between the wire climbing direction and the stretching direction is between 0 degrees and 180 degrees.

In an embodiment of the invention, the pixel island includes at least one protruding portion protruded from the edge of the pixel island, wherein the opening is disposed on the protruding portion.

In an embodiment of the invention, the pixel island has a first edge and a second edge intersected with each other; the connection line is extended along the first edge and enters the pixel island from an opening provided at the second edge.

In an embodiment of the invention, the connection line is extended along the edge and enters the pixel island from the opening disposed at the edge.

In an embodiment of the invention, the pixel island includes: a subpixel unit having a plurality of switching devices and a plurality of capacitive devices; in the pixel island, the connection line is disposed in a region between the plurality of switching devices to be electrically connected to the plurality of switching devices.

In an embodiment of the invention, the pixel island includes: a plurality of subpixel units, wherein each of the subpixel units has a plurality of switching devices and a plurality of capacitive devices; in the pixel island, the connection line is disposed in a region between the switching devices of adjacent subpixel units to be electrically connected to the switching devices of the plurality of adjacent subpixel units.

In an embodiment of the invention, the pixel island includes: a plurality of subpixel units, wherein each of the subpixel units has a plurality of switching devices and a plurality of capacitive devices; in the pixel island, the region between the switching devices of the plurality of adjacent subpixel units has the opening; the connection line enters the pixel island via the opening to be electrically connected to the switching devices of the plurality of adjacent subpixel units, and an extending direction of the connection line and an extending direction of the opening are intersected with each other.

The invention provides a display device including the above device array substrate.

In the device array substrate and the display device of the invention, at least one opening is disposed at least one edge of the pixel island. Moreover, the connection line enters the pixel island via the opening. In this way, when the display device is stretched or compressed, the stress at the connection position of the pixel island and the connection line may be dispersed, thus reducing breakage of the connection line. Moreover, the wiring climbing direction of the connection line may also be changed to further reduce stress.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3A is a partial top view of a device array substrate according to an embodiment of the invention.

FIG. 3B is a partial top view of a device array substrate according to an embodiment of the invention.

FIG. 5A is a partial top view of a device array substrate according to an embodiment of the invention.

FIG. 5B is a partial top view of a device array substrate according to an embodiment of the invention.

DESCRIPTION OF THE EMBODIMENTS

Figure 1:
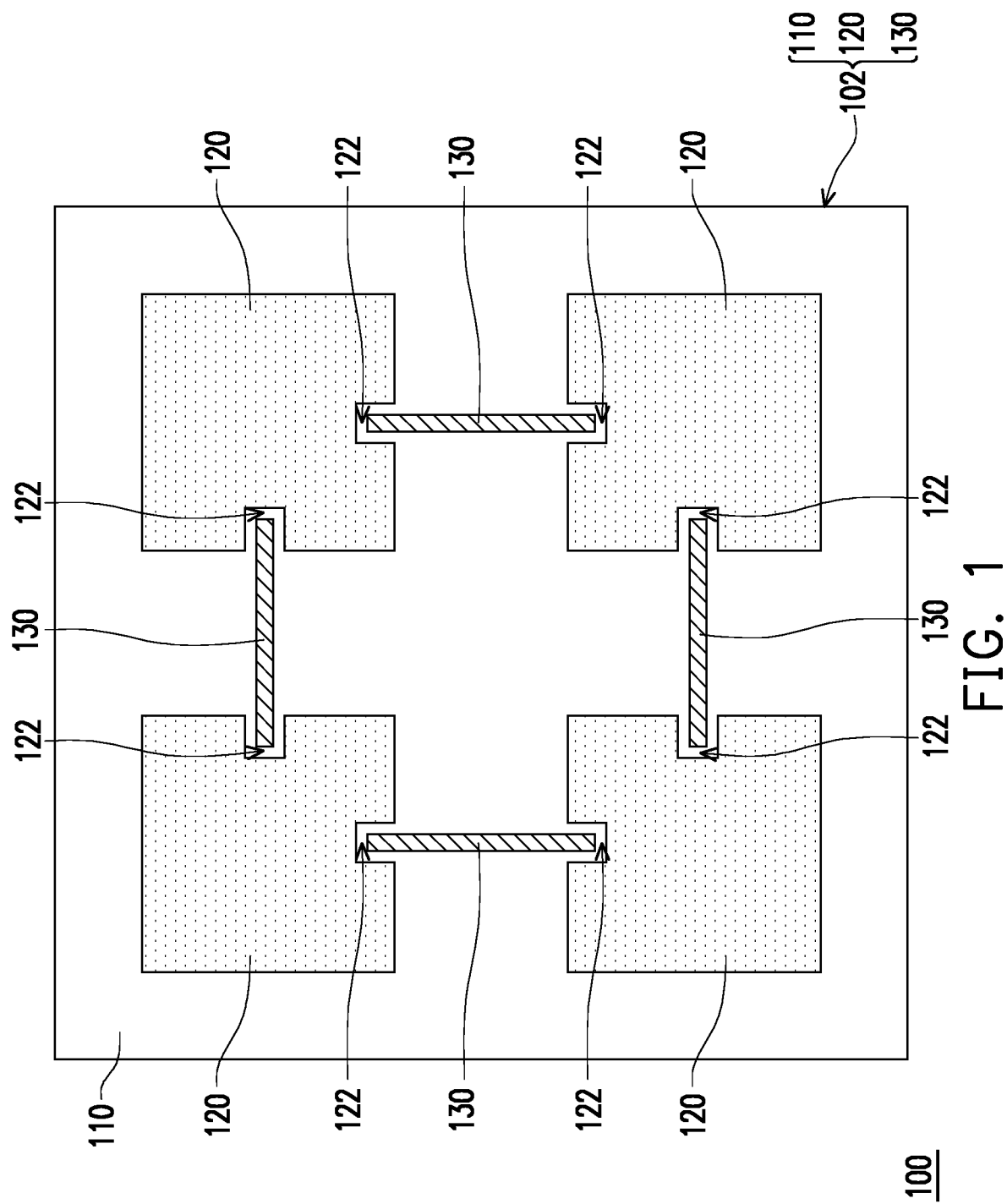
FIG. 1 is a diagram of a display device according to an embodiment of the invention.

FIG. 1 is a diagram of a display device according to an embodiment of the invention. Referring to FIG. 1, a display device 100 is, for example, an organic light-emitting diode (OLED) display. The display device 100 may include: a device array substrate 102.

Referring to FIG. 1, the device array substrate 102 may include a flexible base 110, a pixel island 120, and a connection line 130. The pixel island 120 is disposed on the flexible base 110, and at least one edge of the pixel island 120 is provided with at least one opening 122. The connection line 130 enters the pixel island 120 via the opening 122.

The material of the flexible base 110 is generally a polymer material such as polyimide, polycarbonate, polyether sulfone, polyethylene terephthalate, polyethylene naphthalate, polyarylate, or fiber-reinforced plastic. The material of the flexible base 110 may also be polydimethylsiloxane (PDMS), polyurethane (PU), thermoplastic polyurethane (TPU), thermal plastic, or acrylic or silicone optically clear adhesive. In this way, the flexible base 110 may have bending and stretching properties.

The pixel island 120 refers to a device that does not generate tensile strain or compressive strain when the device array substrate 102 is stretched or compressed. Each pixel island 120 may include one or a plurality of subpixels. The pixel island 120 may also include a pixel group, that is, a plurality of subpixels are used as one pixel group. The pixel island 120 may further have: a thin-film transistor and signal lines connected to the thin-film transistor. The signal lines are, for example, scan signal lines, data signal lines, power signal lines, and ground signal lines. In the pixel island 120, the subpixels used for display may adopt organic light-emitting diode (OLED) devices, or other suitable display devices, such as quantum dot light-emitting devices, etc.

The connection line 130 may be an electrical wire adopting a single-layer structure, a double-layer structure, or a multi-layer structure. The connection line 130 has elastic stretchable properties and is not readily broken. The connection line 130 enables signals between adjacent pixel islands 120 to communicate with each other.

Figure 2A:
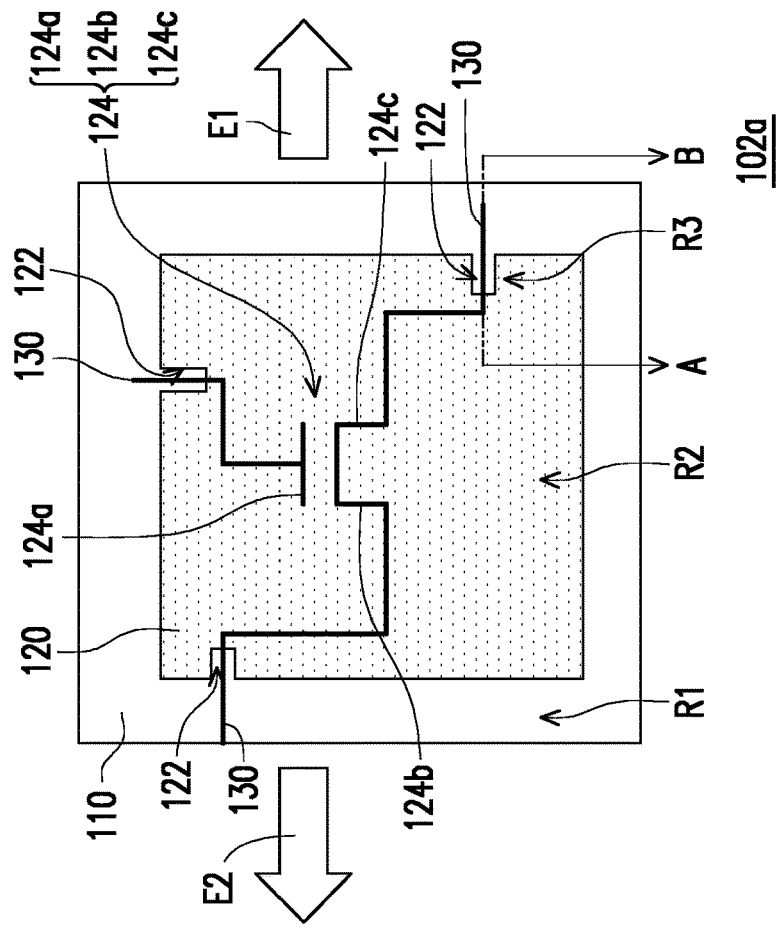
FIG. 2A is a partial top view of a device array substrate according to an embodiment of the invention.
Figure 2B:
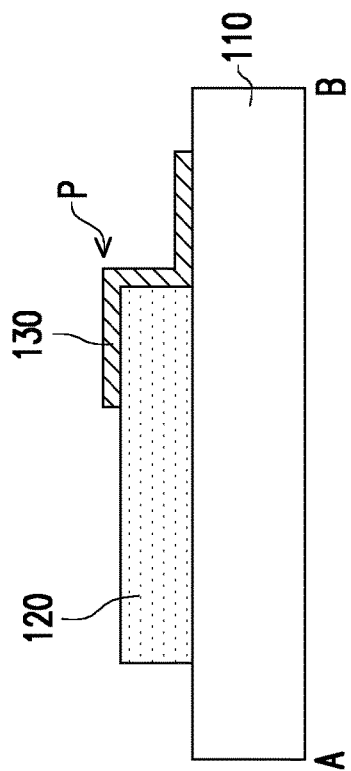
FIG. 2B is a cross-sectional view of the device array substrate of FIG. 2A (before stretching) along section line A-B.
Figure 2C:
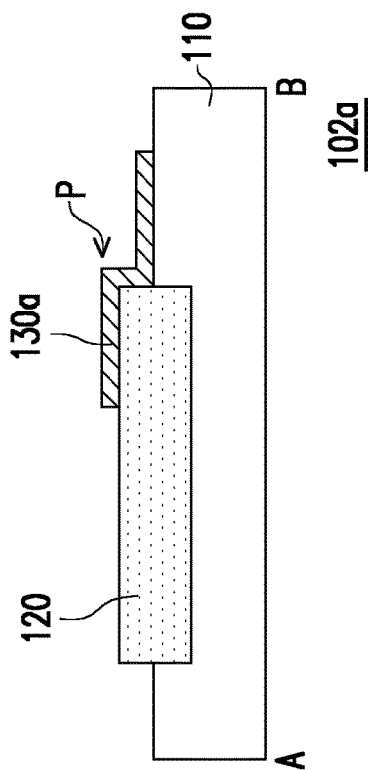
FIG. 2C is a cross-sectional view of the device array substrate of FIG. 2A (after stretching) along section line A-B.

FIG. 2A is a partial top view of a device array substrate according to an embodiment of the invention. FIG. 2B is a cross-sectional view of the device array substrate of FIG. 2A (before stretching) along section line A-B. FIG. 2C is a cross-sectional view of the device array substrate of FIG. 2A (after stretching) along section line A-B.

Referring to FIG. 2A, in a device array substrate 102a, the pixel island 120 may include: at least one switching device 124, and the connection line 130 is electrically connected to the switching device 124 via the opening 122. The switching device 124 may be a thin-film transistor, and has a gate 124a, a source 124b, and a drain 124c. The connection line 130 may be electrically connected to the gate 124a, the source 124b, and the drain 124c, respectively.

Referring to FIG. 2A, the device array substrate 102a may be stretched in stretching directions E1 and E2, wherein the stretching direction E1 faces right in FIG. 2A, and the stretching direction E2 faces left in FIG. 2A. When the device array substrate 102a is stretched, a region R1 having the flexible base 110 generates high strain, a region R2 having the pixel island 120 approximates zero strain, and a region R3 having the opening 122 generates low strain. Therefore, it may be known that by providing the opening 122, the stress at the region R3 may be reduced.

Please continue to refer to FIG. 2B to FIG. 2C. The connection line 130 climbs at a connection position P connected to the pixel island 120. Generally, stress is readily accumulated at the connection position P. However, please refer to FIG. 2A. In an embodiment of the invention, the opening 122 is disposed at an edge of the pixel island 120, and the connection line 130 enters the pixel island 120 from the opening 122. As a result, stress may be dispersed by the opening 122, and therefore the breakage of the connection line 130 may be reduced. Referring to FIG. 2C, after the device array substrate 102a is stretched, the connection line 130 still has a stable structure and may be electrically conducted.

Comparing the strain of the device array substrate 102a before and after stretching, if the device array substrate 102a generates a 5% strain difference, the stress measurement under this condition shows that the maximum stress measured at the position where the opening 122 is not provided is 19.6 MPa; and the maximum stress measured at the position where the opening 122 is provided is 8.95 MPa. After calculation, it may be known that the opening 122 in an embodiment of the invention may effectively reduce the stress by about 54%, that is: (19.6-8.95)/(19.6)=54%.

As described above, in an embodiment of the invention, at least one opening 122 is disposed at least one edge of the pixel island 120, and the connection line 130 enters the pixel island 120 via the opening 122. Via the opening 122, the stress at the connection of the connection line 130 and the pixel island 120 may be effectively reduced, thereby reducing the breakage of the connection line 130.

FIG. 3A is a partial top view of a device array substrate according to an embodiment of the invention. FIG. 3B is a partial top view of a device array substrate according to an embodiment of the invention. In the embodiment of FIG. 3A and FIG. 3B, the same devices as those in FIG. 2A are marked with the same reference numerals, and the same contents are not repeated.

Referring to FIG. 3A, in a device array substrate 102b, a distance D from a side of the opening 122 to a side of the pixel island 120 is greater than or equal to 1 micrometer (μm). Referring to FIG. 3B, in a device array substrate 102c, a distance D from a side of the opening 122 to a side of the pixel island 120 is greater than or equal to 1 micrometer (μm). By setting the distance D, the structure in the vicinity of the opening 122 of the pixel island 120 may be stable, and sufficient mechanical support may be provided to the connection line 130 in the vicinity of the opening 122.

Moreover, referring to FIG. 3A, in the device array substrate 102b, a distance d from an open end of the opening 122 to a closed end of the opening 122 is greater than or equal to 1 micrometer (μm). Referring to FIG. 3B, in the device array substrate 102c, the distance d from the open end of the opening 122 to the closed end of the opening 122 is greater than or equal to 1 micrometer (μm); that is, the depth of the opening 122 is equal to or greater than 1 micrometer (μm). By setting the distance d (that is, the depth of the opening 122), the opening 122 of the pixel island 120 may provide sufficient mechanical shielding to the connection line 130.

Referring to FIG. 3A, the device array substrate 102b may also have compression directions F1 and F2, wherein the compression direction F1 faces downward in FIG. 3A and the compression direction F2 faces upward in FIG. 3A. Referring to FIG. 3A, when the device array substrate 102b is compressed in the compression directions F1 and F2, the connection line 130 extended in the compression directions F1 and F2 also enters the pixel island 120 via the opening 122. The opening 122 may effectively reduce stress at the connection of the connection line 130 and the pixel island 120, and therefore breakage of the connection line 130 in the compression directions F1 and F2 may be reduced.

Referring to FIG. 3A, the shape of the opening 122 may be a quadrangle when viewed from the top view direction of the device array substrate 102b. Referring to FIG. 3B, the shape of the opening 122 may be a semicircle when viewed from the top view direction of the device array substrate 102c. The shapes of the opening 122 above are only examples. In an embodiment of the invention, the shape of the opening 122 may be suitably designed. Although not shown in the figures, the shape of the opening 122 may also be a polygon or a circular arc, and is not limited to the quadrangle of FIG. 3A or the semicircle of FIG. 3B.

Figures 4A, 4B:
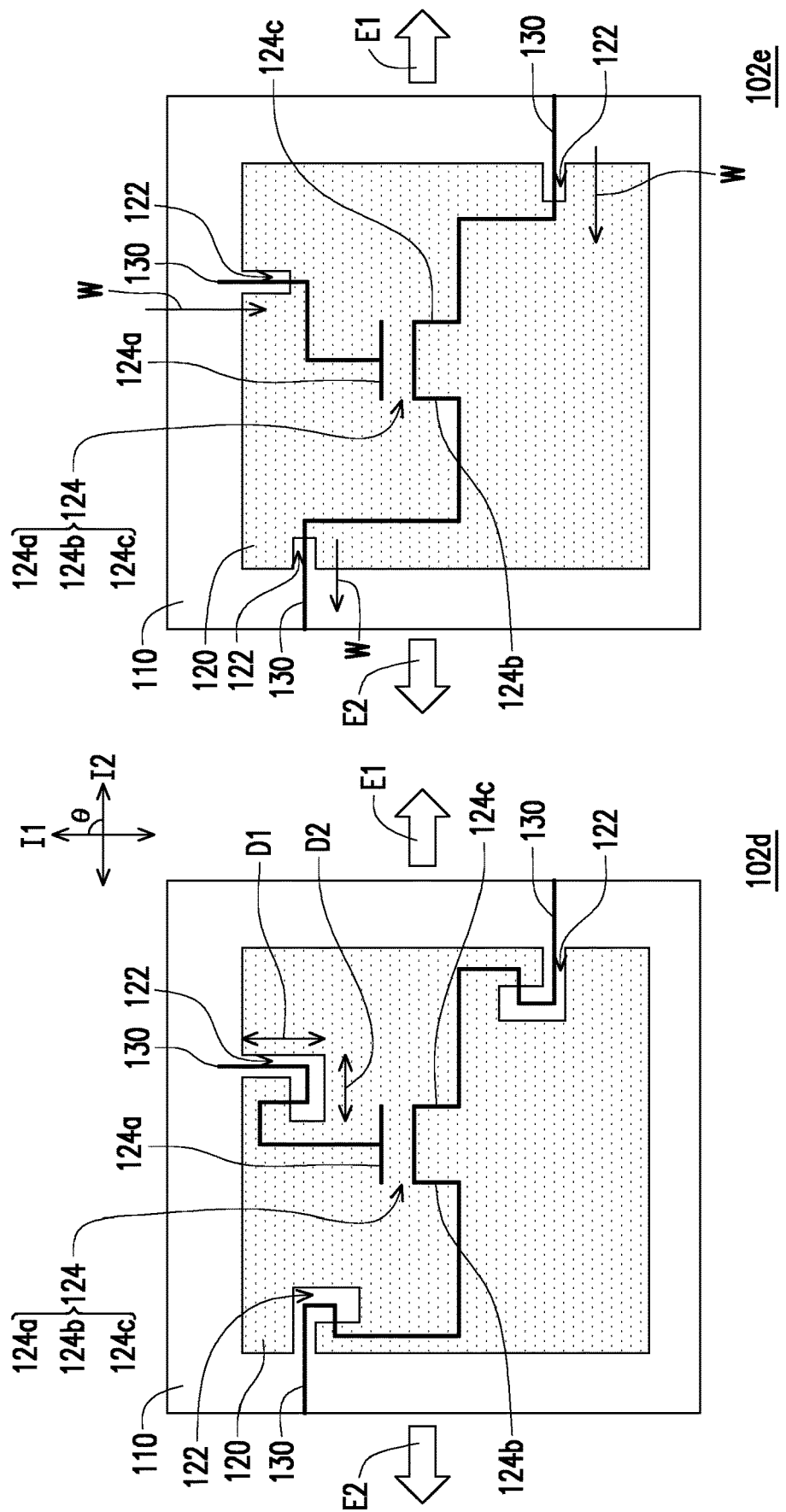
FIG. 4A is a partial top view of a device array substrate according to an embodiment of the invention.
FIG. 4B is a partial top view of a device array substrate according to an embodiment of the invention.

FIG. 4A is a partial top view of a device array substrate according to an embodiment of the invention. FIG. 4B is a partial top view of a device array substrate according to an embodiment of the invention. In the embodiment of FIG. 4A and FIG. 4B, the same devices as those in FIG. 2A are marked with the same reference numerals, and the same contents are not repeated.

Referring to FIG. 4A, in a device array substrate 102d, the opening 122 is extended by a first distance D1 inside the pixel island 120 in a first direction I1; the opening 122 is extended by a second distance D2 inside the pixel island 120 in a second direction I2; and there is a set angle θ between the first direction I1 and the second direction I2. The first distance D1 and the second distance D2 may be suitably set according to the actual size of the pixel island 120. Referring to FIG. 4A, the set angle θ may be 90 degrees; and in other embodiments, the set angle θ may also be other suitably set angles.

Referring to FIG. 4A, when the opening 122 is extended in the different first direction I1 and second direction I2, a planar opening 122 may be formed. In this way, the connection line 130 extended in the planar opening 122 may be bent, which is beneficial to the circuit layout of the connection line 130. In addition, when the device array substrate 102d is stretched in the stretching directions E1 and E2, since the connection line 130 is located inside the planar opening 122 of the pixel island 120, a mechanical shield may be provided to the connection line 130 to reduce the transmission of stress to the connection line 130, and thus avoid breakage of the connection line 130.

Referring to FIG. 4B, in a device array substrate 102e, the connection line 130 has a wiring climbing direction W. The device array substrate 102e has the stretching directions E1 and E2. The angle between the wiring climbing direction W and the stretching directions E1 and E2 is between 0 degrees and 180 degrees. In detail, referring to the lower right portion of FIG. 4B, the angle between the wiring climbing direction W of the connection line 130 and the stretching direction E1 is 180 degrees (that is, the directions are opposite to each other). Referring to the upper portion of FIG. 4B, the angle between the wiring climbing direction W of the connection line 130 and the stretching directions E1 and E2 is 90 degrees (that is, perpendicular to each other). Referring to the upper left portion of FIG. 4B, the angle between the wiring climbing direction W of the connection line 130 and the stretching direction E2 is 0 degrees (that is, in the same direction). The wiring climbing direction W of the connection line 130 may be suitably set so that the angle between the wiring climbing direction W and the stretching directions E1 and E2 is between 0 degrees and 180 degrees.

In this way, the angle of the wiring climbing direction W of the connection line 130 relative to the stretching directions E1 and E2 may be set, so as to suitably set the wiring climbing direction of the connection line 130. Therefore, stress may be further reduced, and the layout freedom of the connection line 130 in the pixel island 120 may be increased.

FIG. 5A is a partial top view of a device array substrate according to an embodiment of the invention. FIG. 5B is a partial top view of a device array substrate according to an embodiment of the invention. In the embodiment of FIG. 5A and FIG. 5B, the same devices as those in FIG. 2A are marked with the same reference numerals, and the same contents are not repeated.

Please refer to FIG. 5A. In a device array substrate 102f, the pixel island 120 may include: at least one protruding portion 126 protruded from an edge of the pixel island 120, wherein the opening 122 is disposed on the protruding portion 126. Please refer to FIG. 5B. In a device array substrate 102g, the pixel island 120 may include: at least one protruding portion 126 protruded from an edge of the pixel island 120, wherein the opening 122 is disposed on the protruding portion 126.

In the present embodiment, the protruding portion 126 is additionally provided, the opening 122 is disposed on the protruding portion 126, and the connection line 130 enters the pixel island 120 from the opening 122 disposed at the protruding portion 126. In this way, the opening 122 may be disposed without occupying the area in the pixel island 120, and therefore the layout area of electronic devices in the pixel island 120 may be increased. As a result, the design freedom of electronic devices (for example, subpixels) in the pixel island 120 may be effectively increased.

Figure 6A:
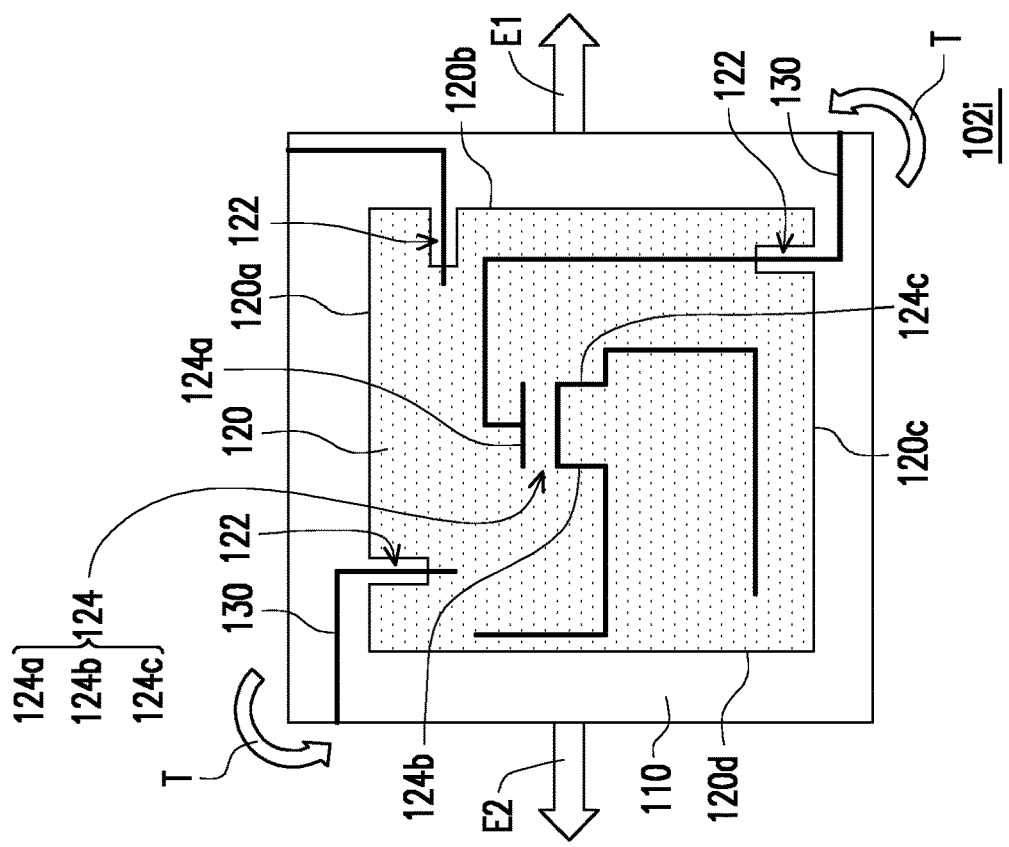
FIG. 6A is a partial top view of a device array substrate according to an embodiment of the invention.
Figure 6B:
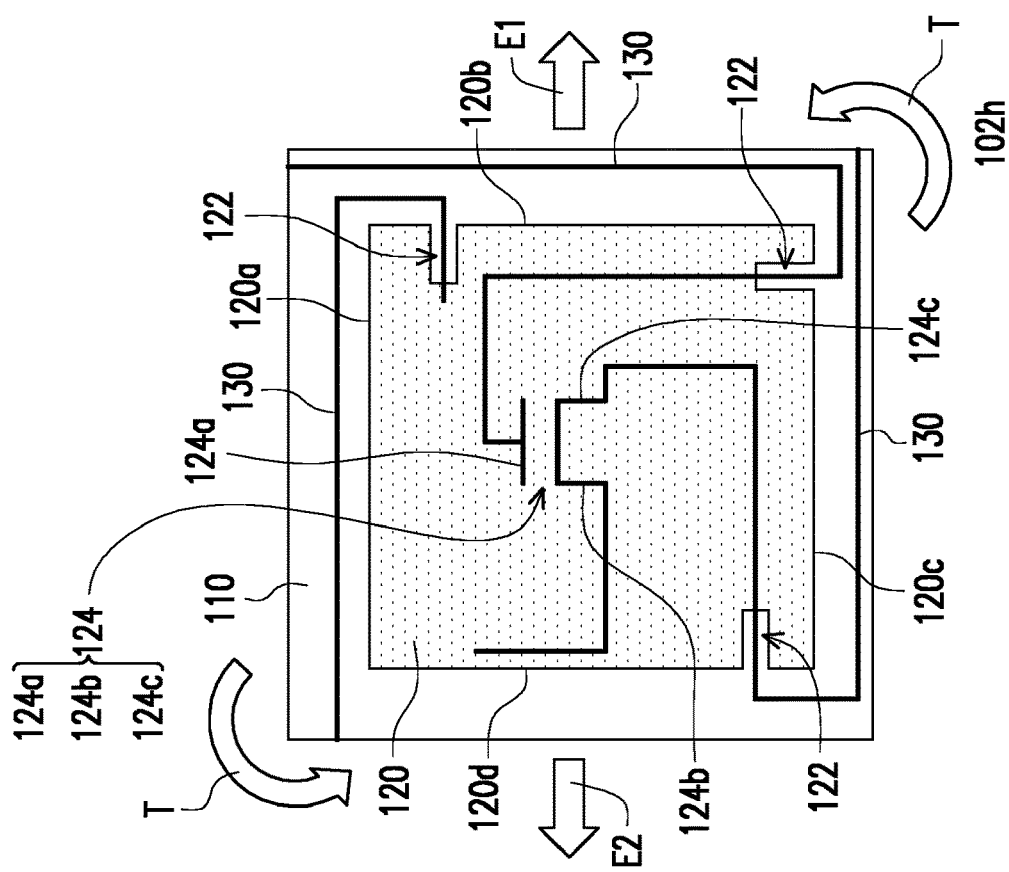
FIG. 6B is a partial top view of a device array substrate according to an embodiment of the invention.

FIG. 6A is a partial top view of a device array substrate according to an embodiment of the invention. FIG. 6B is a partial top view of a device array substrate according to an embodiment of the invention. In the embodiment of FIG. 6A and FIG. 6B, the same devices as those in FIG. 2A are marked with the same reference numerals, and the same contents are not repeated.

Referring to the upper portion of FIG. 6A, in a device array substrate 102h, the pixel island 120 has an edge 120a and an edge 120b intersected with each other; and the connection line 130 is extended along the edge 120a and enters the pixel island 120 from the opening 122 disposed at the edge 120b. Referring to the right portion of FIG. 6A, the pixel island 120 has the edge 120b and an edge 120c intersected with each other; and the connection line 130 is extended along the edge 120b and enters the pixel island 120 from the opening 122 disposed at the edge 120c. Referring to the left portion of FIG. 6A, the pixel island 120 has the edge 120c and an edge 120d intersected with each other; and the connection line 130 is extended along the edge 120c and enters the pixel island 120 from the opening 122 disposed at the edge 120d.

Referring to the left portion of FIG. 6B, in a device array substrate 102i, the connection line 130 is extended along the edge 120a, and enters the pixel island 122 from the opening 122 disposed at the edge 120a. Referring to the right portion of FIG. 6B, the connection line 130 is extended along the edge 120b, and enters the pixel island 122 from the opening 122 disposed at the edge 120b. Referring to the lower portion of FIG. 6B, the connection line 130 is extended along the edge 120c, and enters the pixel island 122 from the opening 122 disposed at the edge 120c.

Referring to FIG. 6A and FIG. 6B, in the device array substrates 102h and 102i, different openings 122 may be located at different edges of the pixel island 120, and the extending direction of the connection line 130 and the position thereof of entering the pixel island 120 are configured to have symmetry in space. In this way, the spatial distribution of the opening 122 on the pixel island 120 may be more even. Moreover, when the device array substrates 102h and 102i are stretched along the stretching directions E1 and E2, the tensile force causes the pixel island 120 to be rotated along a rotation direction T, thus reducing the tensile strain of the device array substrates 102h and 102i.

Figures 7A, 7B:
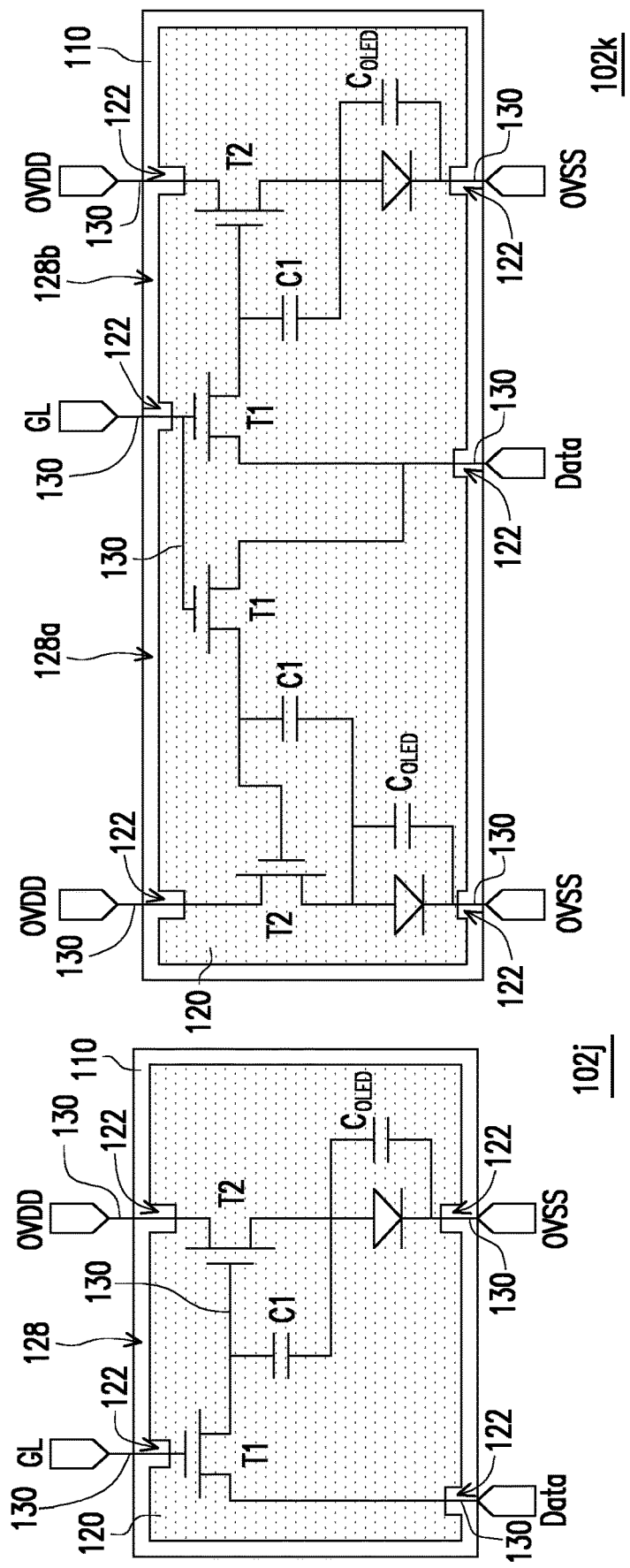
FIG. 7A is a partial top view of a device array substrate according to an embodiment of the invention.
FIG. 7B is a partial top view of a device array substrate according to an embodiment of the invention.

FIG. 7A is a partial top view of a device array substrate according to an embodiment of the invention. FIG. 7B is a partial top view of a device array substrate according to an embodiment of the invention. In the embodiment of FIG. 7A and FIG. 7B, the same devices as those in FIG. 2A are marked with the same reference numerals, and the same contents are not repeated.

Referring to FIG. 7A, in a device array substrate 102j, the pixel island 120 includes: a subpixel unit 128 having a plurality of switching devices T1 and T2 and a plurality of capacitive devices C1 and Corn; in the pixel island 120, the connection line 130 is disposed in a region between the plurality of switching devices T1 and T2 to be electrically connected to the plurality of switching devices T1 and T2.

Referring to FIG. 7A, the device array substrate 102j further includes: a gate terminal GL, a data terminal Data, a source terminal OVSS, and a drain terminal OVDD that are connected to the switching devices T1 and T2 and the capacitive devices C1 and $C_{OLED}$ via the connection line 130.

Referring to FIG. 7A, in the subpixel unit 128, the opening 122 is not disposed on the path of the connection line 130 between the plurality of switching devices T1 and T2. In addition, the opening 122 is disposed at an edge of the pixel island 120 so that the stress of the connection line 130 extended out from the subpixel unit 128 (that is, four connection lines 130 respectively connected to the gate terminal GL, the data terminal Data, the source terminal OVSS, and the drain terminal OVDD) may be reduced by the function of the opening 122, so that breakage may be avoided.

Referring to FIG. 7B, in a device array substrate 102k, the pixel island 120 includes: a plurality of subpixel units 128a and 128b, wherein each of the subpixel units 128a and 128b has the plurality of switching devices T1 and T2 and the plurality of capacitive devices C1 and $C_{OLED}$; in the pixel island 120, the region between the switching devices T1 and T2 of the plurality of adjacent subpixel units 128a and 128b is provided with the connection line 130 to be electrically connected to the switching devices T1 and T2 of the plurality of adjacent subpixel units 128a and 128b.

Referring to FIG. 7B, within the same pixel island 120, the plurality of subpixel units 128a and 128b may be provided. Similarly, in the subpixel units 128a and 128b, the opening 122 is not disposed on the path of the connection line 130 between the plurality of switching devices T1 and T2 and the plurality of capacitive devices C1 and $C_{OLED}$. In addition, the opening 122 is disposed at an edge of the pixel island 120 so that the stress of the connection line 130 extended out from the subpixel unit 128 (that is, six connection lines 130 respectively connected to the gate terminal GL, the data terminal Data, two source terminals OVSS, and two drain terminals OVDD) may be reduced by the function of the opening 122, so that breakage may be avoided.

Figure 8:
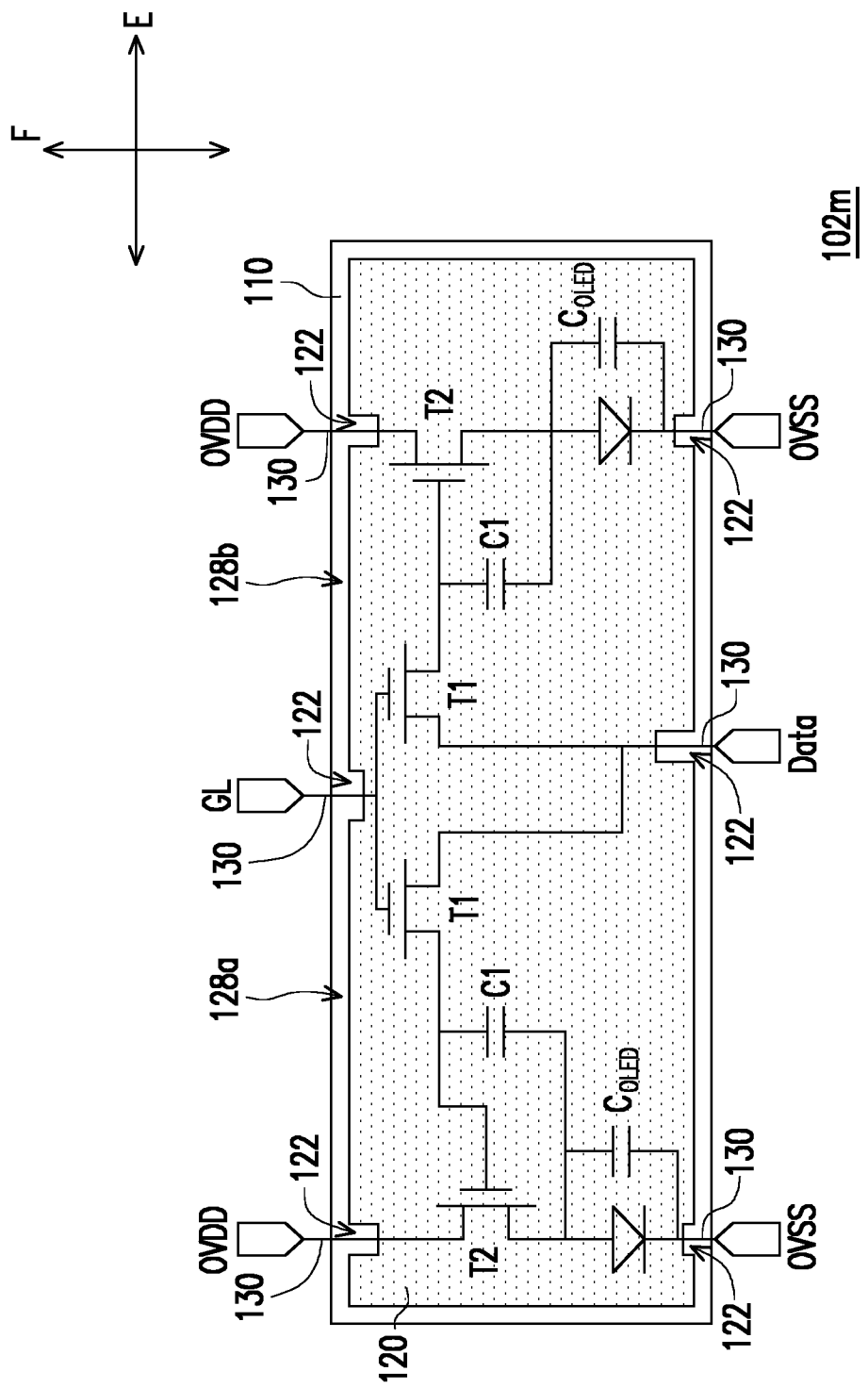
FIG. 8 is a partial top view of a device array substrate according to an embodiment of the invention.

FIG. 8 is a partial top view of a device array substrate according to an embodiment of the invention. In the embodiment of FIG. 8, the same devices as those in FIG. 2A are marked with the same reference numerals, and the same contents are not repeated.

Please refer to FIG. 8. In a device array substrate 102m, the pixel island 120 includes: the plurality of subpixel units 128a and 128b, and each of the subpixel units 128a and 128b has the plurality of switching devices T1 and T2 and the plurality of capacitive devices C1 and $C_{OLED}$ In the pixel island 120, the region between the switching devices T1 and T2 of the plurality of adjacent subpixel units 128a and 128b has the opening 122; the connection line 130 enters the pixel island 120 via the opening 122 to be electrically connected to the switching devices T1 and T2 of the plurality of adjacent subpixel units 128a and 128b, and an extending direction F of the connection line 130 and an extending direction E of the opening 122 are intersected with each other.

Referring to FIG. 8, the connection line 130 between the switching devices T1 and T2 of the adjacent subpixel units 128a and 128b share the same opening 122. In this way, the number of the opening 122 may be reduced to simplify the structure of the device array substrate 102m.

In addition, the display device 100 of an embodiment of the invention may include: the device array substrates 102, 102a to 102k, and 102m of any of FIG. 2A to FIG. 8. In addition, the device array substrates 102, 102a to 102k, and 102m of the embodiments of the invention may be applied to other suitable electronic devices in addition to the display device 100, so that the electronic devices have tensile or compression properties. In addition, the connection line 130 is not readily broken during the act of stretching or compression.

Based on the above, the device array substrate and the display device of the invention have at least the following technical effects: at least one opening is disposed at at least one edge of the pixel island. Moreover, the connection line enters the pixel island via the opening. In this way, when the display device is stretched, the stress may be dispersed and the breakage of the connection line may be reduced. In addition, the wiring climbing direction of the connection line may be suitably set to further reduce stress.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A device array substrate, comprising:
   a flexible base;
   a pixel island disposed on the flexible base, wherein at least one edge of the pixel island is provided with at least one opening; and
   a connection line entering the pixel island via the opening, wherein a portion of the connection line entering the pixel island via the opening is in contact with the flexible base, the connection line is in contact with a topmost surface of the pixel island, the pixel island has a plurality of sidewalls in the opening, the connection line is connected to one of the plurality of sidewalls of the pixel island and spaced apart from the rest of the plurality of sidewalls of the pixel island, and the connection line continuously extends from the flexible base to the one of the plurality of sidewalls of the pixel island and from the one of the plurality of sidewalls of the pixel island to the topmost surface of the pixel island.

2. The device array substrate of claim 1, wherein the pixel island comprises:
   at least one switching device,
   the connection line is electrically connected to the switching device via the opening.

3. The device array substrate of claim 1, wherein,
   a distance from a side of the opening to a side of the pixel island is greater than or equal to 1 micrometer.

4. The device array substrate of claim 1, wherein,
   a distance from an open end of the opening to a closed end of the opening is greater than or equal to 1 micrometer.

5. The device array substrate of claim 1, wherein,
   when viewed from a top view direction of the device array substrate, a shape of the opening comprises: a quadrangle, a semicircle, a polygon, or a circular arc.

6. The device array substrate of claim 1, wherein,
   the opening is extended by a first distance inside the pixel island in a first direction,
   the opening is extended by a second distance inside the pixel island in a second direction,
   there is a set angle between the first direction and the second direction.

7. The device array substrate of claim 1, wherein,
   the connection line has a wiring climbing direction,
   the device array substrate has a stretching direction,
   an angle between the wiring climbing direction and the stretching direction is between 0 degrees and 180 degrees.

8. The device array substrate of claim 1, wherein the pixel island comprises:
   at least one protruding portion protruded from the edge of the pixel island;
   wherein the opening is disposed on the protruding portion.

9. The device array substrate of claim 1, wherein,
   the pixel island has a first edge and a second edge intersected with each other;
   the connection line is extended along the first edge and enters the pixel island from an opening disposed at the second edge.

10. The device array substrate of claim 1, wherein,
    the connection line is extended along the edge and enters the pixel island from an opening disposed at the edge.

11. The device array substrate of claim 1, wherein the pixel island comprises:
    a subpixel unit having a plurality of switching devices and a plurality of capacitive devices;
    in the pixel island, the connection line is disposed in a region between the switching devices to be electrically connected to the switching devices.

12. The device array substrate of claim 1, wherein the pixel island comprises:
    a plurality of subpixel units, wherein each of the subpixel units has a plurality of switching devices and a plurality of capacitive devices;
    in the pixel island, a region between the switching devices of adjacent subpixel units is provided with the connection line to be electrically connected to the switching devices of the adjacent subpixel units.

13. The device array substrate of claim 1, wherein the pixel island comprises:
    a plurality of subpixel units, wherein each of the subpixel units has a plurality of switching devices and a plurality of capacitive devices;
    in the pixel island, a region between the switching devices of adjacent subpixel units has the opening;
    the connection line enters the pixel island via the opening to be electrically connected to the switching devices of the adjacent subpixel units, and
    an extending direction of the connection line and an extending direction of the opening are intersected with each other.

14. The device array substrate of claim 1, wherein the connection line comprises a single-layer structure, a double-layer structure, or a multi-layer structure.

15. A display device, comprising:
    a flexible base;
    a pixel island disposed on the flexible base, wherein the pixel island comprises a groove exposing a portion of a top surface of the flexible base, and a sidewall of the groove and the portion of the top surface of the flexible base create a space with the pixel island; and
    a connection line entering the pixel island through the space, wherein a sidewall of the connection line is spaced apart from the sidewall of the groove, a bottom surface of the connection line is continuously in contact with the portion of the top surface of the flexible base, the sidewall of the groove and a topmost surface of the pixel island, and the bottom surface of the connection line connects with the sidewall of the connection line.

16. The display device of claim 15, wherein the connection line comprises a single-layer structure, a double-layer structure, or a multi-layer structure.

17. The display device of claim 15, wherein the pixel island comprises:
    at least one switching device,
    the connection line is electrically connected to the switching device via the groove.

18. The display device of claim 15, wherein,
    when viewed from a top view direction of the display device, a shape of the groove comprises: a quadrangle, a semicircle, a polygon, or a circular arc.

19. The display device of claim 15, wherein,
    the connection line has a wiring climbing direction, and along the wiring climbing direction, a distance from an open end of the groove to the sidewall of the groove is greater than or equal to 1 micrometer.

\* \* \* \* \*